United States Patent
Harvey

(10) Patent No.: US 7,253,633 B2
(45) Date of Patent: Aug. 7, 2007

(54) THRESHOLD ADJUSTMENT ACCURACY FOR GROUND FAULT CONDITION DETERMINATION

(75) Inventor: Ronald C. Harvey, Ocean Springs, MS (US)

(73) Assignee: Northrop Grumman Corporation, Los Angeles, CA (US)

( * ) Notice: Subject to any disclaimer, the term of this patent is extended or adjusted under 35 U.S.C. 154(b) by 141 days.

(21) Appl. No.: 10/910,819

(22) Filed: Aug. 5, 2004

(65) Prior Publication Data

US 2005/0036249 A1 Feb. 17, 2005

(51) Int. Cl.
*G01R 31/08* (2006.01)
*H02H 3/00* (2006.01)

(52) U.S. Cl. .................. 324/509; 324/512; 324/521; 324/522; 361/42

(58) Field of Classification Search ............. 324/512, 324/521

See application file for complete search history.

(56) References Cited

U.S. PATENT DOCUMENTS

| | | | | |
|---|---|---|---|---|
| 4,053,876 A | * | 10/1977 | Taylor | 340/529 |
| 5,065,104 A | * | 11/1991 | Kusko et al. | 324/508 |
| 5,481,194 A | * | 1/1996 | Schantz et al. | 324/522 |
| 5,495,384 A | * | 2/1996 | Wallis et al. | 361/64 |
| 5,691,870 A | * | 11/1997 | Gebara | 361/86 |
| 6,856,137 B2 | * | 2/2005 | Roden et al. | 324/509 |
| 2002/0121902 A1 | * | 9/2002 | Suzuki | 324/509 |

FOREIGN PATENT DOCUMENTS

| | | |
|---|---|---|
| DE | 35 14 449 | 10/1986 |
| DE | 39 23 594 | 2/1990 |
| DE | 41 09 586 | 9/1992 |
| JP | 2000 308254 | 11/2000 |
| RU | 2 155 424 | 8/2000 |

* cited by examiner

*Primary Examiner*—Anjan Deb
*Assistant Examiner*—John Zhu
(74) *Attorney, Agent, or Firm*—Carmen B. Patti & Assoc. LLC

(57) ABSTRACT

A polyphase power system with a system safety ground supplies a plurality of power phases over a respective plurality of power lines to power a load. A plurality of phase fault detectors of a fault detection component monitor the plurality of power lines, respectively. A phase fault detector, of the plurality of phase fault detectors, monitors a power line of the plurality of power lines. The phase fault detector outputs a threshold voltage with a voltage divider coupled with the power line. The threshold voltage is a line-to-ground voltage relative to a localized ground. A capacitor coupled between the localized ground and the system safety ground provides a direct current offset to the localized ground upon a ground fault condition. The phase fault detector compares the threshold voltage with a reference voltage to make a determination of an existence of the ground fault condition in the power line.

17 Claims, 4 Drawing Sheets

THRESHOLD ADJUSTMENT ACCURACY FOR GROUND FAULT CONDITION DETERMINATION

TECHNICAL FIELD

The invention relates generally to ground fault detectors and more particularly to ground fault detectors in polyphase power systems.

BACKGROUND

Polyphase power systems are designed to supply electrical power to a balanced system load. A failure of a connection may cause power to be diverted to a grounded surface and result in a ground fault. Ground fault detectors provide an indication of an existence of leakage currents associated with the ground fault. Transient leakage currents are created when equipment powered by the polyphase power system is turned on or off. When equipment is turned on or off, ground fault detectors may incorrectly indicate a ground fault. The incorrect indication of a ground fault undesirably wastes time for technicians who consequently must attempt to discover the cause of the indicated ground fault.

Thus, a need exists for an increase in accuracy of ground fault detection for a polyphase power system.

SUMMARY

The invention in one implementation encompasses an apparatus that comprises a fault detection component that employs one or more voltage dividers to promote an accuracy for adjustment of a threshold that is employable for a determination of an existence of one or more ground fault conditions in one or more of a plurality of power lines. A polyphase power system with a system safety ground supplies a plurality of power phases over the plurality of power lines, respectively, to power a load.

DESCRIPTION OF THE DRAWINGS

Features of exemplary implementations of the invention will become apparent from the description, the claims, and the accompanying drawings in which:

DETAILED DESCRIPTION

Turning to FIGS. 1-4, an apparatus 100 in one example comprises a plurality of components such as hardware components. A number of such components can be combined or divided in the apparatus 100. For illustrative purposes, exemplary values for resistors, capacitors, diodes, including light-emitting diodes, and operational amplifiers are presented.

Figure 1:
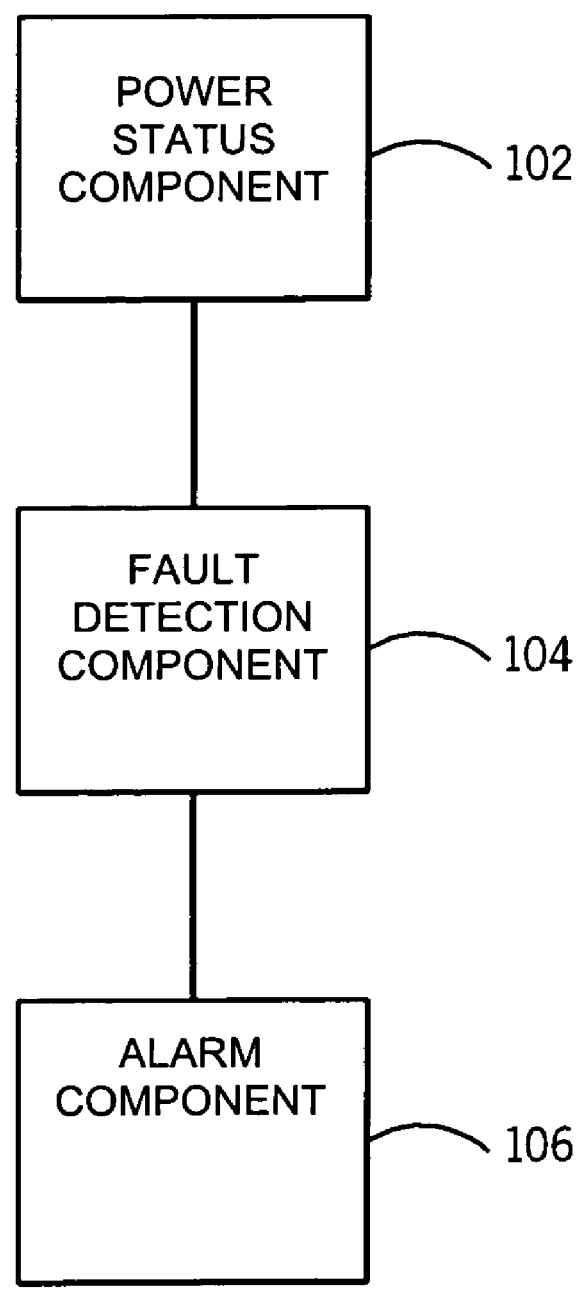
FIG. 1 is a representation of an implementation of an apparatus that comprises one or more power status components, one or more fault detection components, and one or more alarm components.

Referring to FIG. 1, the apparatus 100 in one example comprises one or more power status components 102, one or more fault detection components 104, and one or more alarm components 106. The power status component 102 in one example serves to indicate current status of a plurality of power phases, for example, alternating current ("AC") power lines of a polyphase power system 202 (FIG. 2), as described herein. The fault detection component 104 in one example serves to monitor the plurality of power phases to determine an existence of a ground fault condition within one or more of the plurality of power phases. The alarm components 106 in one example serve to promote an increase in accuracy of a ground fault indication, as described herein.

Figure 2:
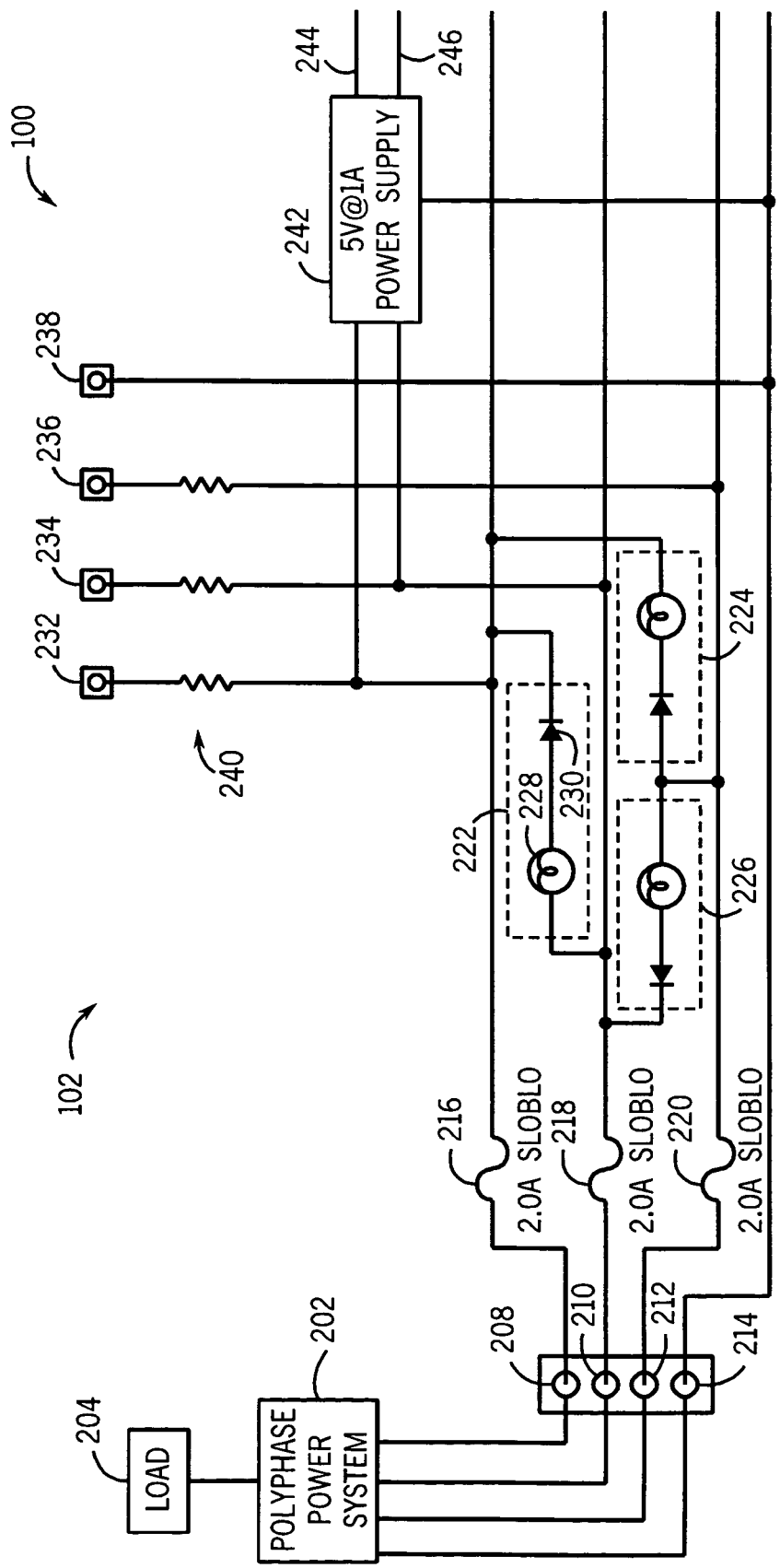
FIG. 2 is a schematic representation of an exemplary power status component of the apparatus of FIG. 1, and illustrates a polyphase power system that is coupled with the apparatus and supplies power to a load.

Referring to FIG. 2, the power status component 102 in one example comprises a plurality of phase terminals 208, 210, and 212 coupled with the polyphase power system 202. The polyphase power system 202 in one example supplies a plurality of power phases to power a load 204. The load 204 in one example comprises a plurality of sub-loads, for example, one load per power phase of the polyphase power system 202. The load 204 in one example is generally balanced, for example, each sub-load comprises a substantially same impedance value, as will be understood by those skilled in the art. In one example, the polyphase power system 202 comprises a three-phase power system.

The phase terminals 208, 210, and 212 are coupled with an ungrounded delta-connected generator of the polyphase power system 202. The power status component 102 in one example comprises a neutral terminal 214 coupled with a system safety ground from the polyphase power system 202. The phase terminal 208, phase terminal 210, and phase terminal 212 comprise power phases that are separated by one hundred and twenty degrees. The phase terminals 208, 210, and 212 comprise a line-to-line voltage between another of the phase terminals 208, 210, and 212 and a line-to-ground voltage between the neutral terminal 214. The line-to-line voltage is equal to the line-to-ground voltage times the square root of three when the load on the lines is balanced, as will be appreciated by those skilled in the art.

The power status component 102 in one example comprises one or more fuses 216, 218, and 220 and one or more power indicator components 222, 224, and 226. The power status component 102 employs the fuses 216, 218, and 220, to protect the phase terminals 208, 210, and 212, respectively. The power status component 102 in one example employs the power indicator components 222, 224, and 226 to provide an indication of power across the phase terminals 208, 210, and 212. The power indicator components 222, 224, and 226 in one example comprise a neon lamp 228 and a diode 230. When a voltage differential exists between two phase terminals, the neon lamp is lit, indicating that there is power across the phase terminals, as will be appreciated by those skilled in the art. In one example, the power indicator 222 indicates presence of the line-to-line voltage across the phase terminals 208 and 210, the power indicator 224 indicates presence of the line-to-line voltage across the phase terminals 208 and 212, and the power indicator 226 indicates presence of the line-to-line voltage across the phase terminals 210 and 212.

The power status component 102 in one example comprises one or more test terminals 232, 234, 236, and 238 and one or more resistors 240 for providing test points of the phase terminals 208, 210, 212, and the neutral terminal 214, respectively. The power status component 102 in one example comprises an alternating current to direct current converter 242 that employs the phase terminals 208 and 210 and the neutral terminal 214 to create one or more direct current terminals 244 and one or more localized grounds 246. The direct current terminal 244 in one example supplies a voltage of five volts.

Figure 3:
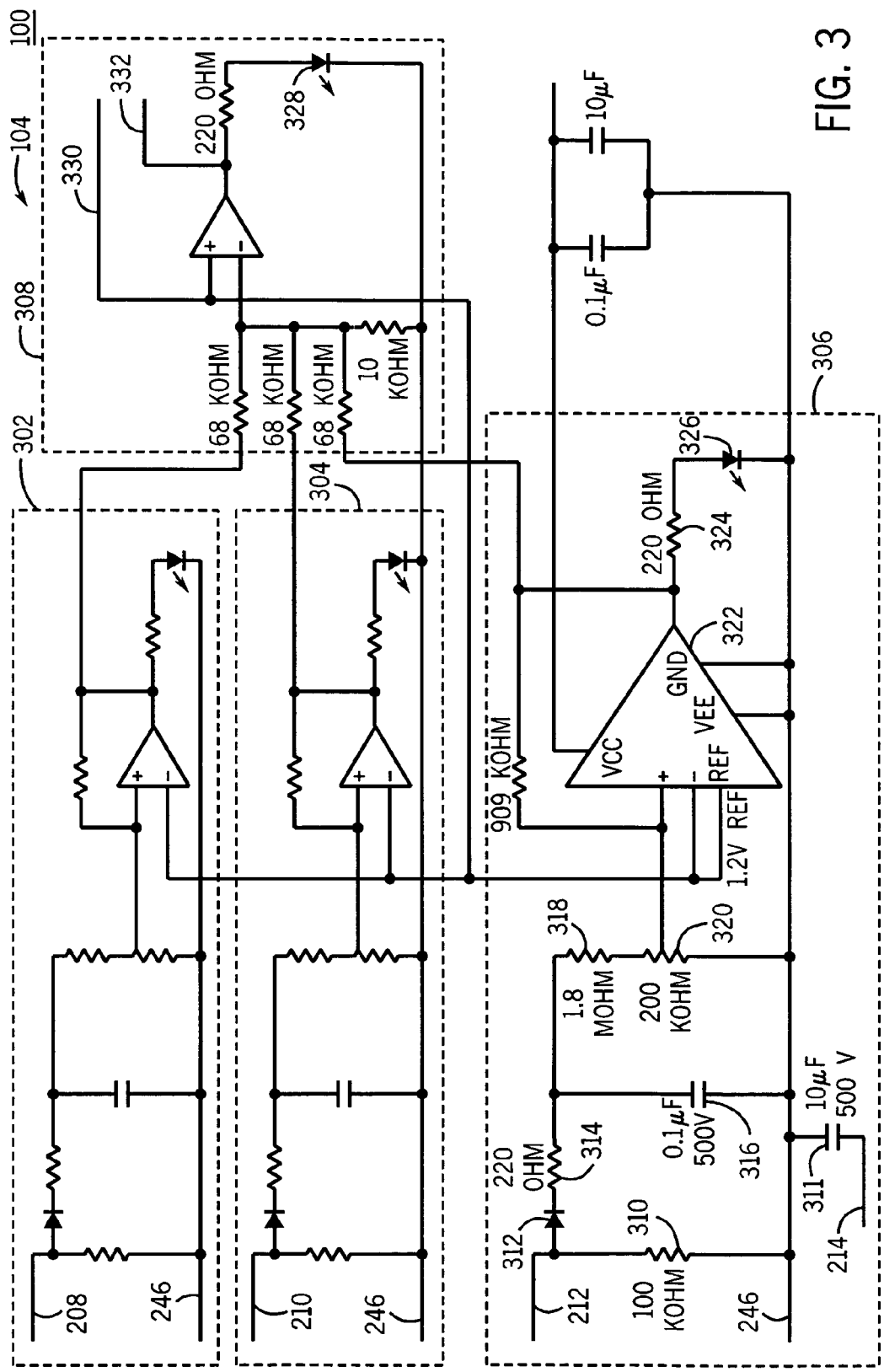
FIG. 3 is a schematic representation of an exemplary fault detection component of the apparatus of FIG. 1.

Referring to FIG. 3, the fault detection component 104 in one example comprises a plurality of phase fault detectors 302, 304, and 306 and one or more fault indicators 308. The phase fault detectors 302, 304, and 306 in one example serve to determine an existence of a ground fault condition within one or more of the plurality of power phases. The phase fault detectors 302, 304, and 306 cooperate to detect unbalanced leakage currents in the system load. For example, the phase fault detector 306 employs an operational amplifier circuit to compare the line-to-ground voltage of the phase terminal 212 with a reference voltage.

An illustrative description of exemplary operation of the phase fault detector 306 is presented, for explanatory purposes. The line-to-line voltage of the phase terminals 208, 210, and 212 in one example comprises 120 Volts. A resistor 310 provides a phase reference from the phase terminal 212 to the localized ground 246. The localized ground 246 is coupled with the neutral terminal 214 by a capacitor 311. A diode 312 and a resistor 314 allow a positive cycle of the line-to-ground voltage of the phase terminal 212 to charge a capacitor 316. The capacitor 311 provides a reference to the neutral terminal 214. Unbalanced leakage currents will flow into the safety ground at the system load. In a balanced load condition, there is no potential difference between the neutral terminal 214 and the localized ground 246, thus no current will flow through the capacitor 311. On unbalanced loads an AC current will flow through the localized ground 246. The capacitor 311 will smooth these currents providing essentially a DC offset on the localized ground 246 relative to the neutral terminal 214. This offset affects a low voltage threshold sensitivity of the phase fault detector 306. The ratio of impedance of the capacitor 311 to impedance of the capacitor 316 affects sensitivity levels of the phase fault detector 306. For example, the capacitor promotes an adjustability of the sensitivity of the detection of ground fault condition. The capacitor 316 in one example is charged to approximately the peak line-to-ground voltage of the phase terminal 212 and discharges approximately ten percent between peaks.

Two or more resistors 318 and 320 serve to provide a voltage divider for the line-to-ground voltage of the phase terminal 212. For example, the resistors 318 and 320 provide a divided voltage to a comparator component 322. The comparator component 322 in one example comprises an operational amplifier circuit as a comparator. The comparator component 322 in one example compares the divided voltage with the reference voltage to determine if the line-to-ground voltage is above a given threshold. In one example, the reference voltage comprises a voltage of 1.2 volts. When the divided voltage is greater than the reference voltage, then the line-to-ground voltage is within an acceptable level. The threshold can be adjusted by changing the resistance of the resistor 320. For example, a lower resistance of the resistor 320 will increase the threshold of the comparator. When the divided voltage is greater than the reference voltage, the operational amplifier of the comparator component 322 supplies a voltage across a resistor 324 and a light-emitting diode 326, causing the light-emitting diode 326 to turn "ON." When the divided voltage is less than the reference voltage, the operational amplifier of the comparator component 322 supplies no voltage to the light-emitting diode 326, and the light-emitting diode 326 turns "OFF." The phase fault detectors 302 and 304 function analogously to the phase fault detector 306.

The fault indicator 308 in one example is electrically connected with the phase fault detectors 302, 304, and 306. When one or more of the line-to-ground voltages of the phase terminals 208, 210, and 212 drops below the given threshold, the fault indicator 308 turns a light-emitting diode 328 "ON." For example, the phase fault detectors 302, 304, and 306 comprise green light-emitting diodes, and the fault indicator 308 comprises a red diode. Under normal operating conditions with no faults detected, the green light-emitting diodes are "ON" and the red light-emitting diode is "OFF." Once a fault is detected on one or more of the phase terminals 208, 210, and 212, the corresponding green light-emitting diode turns "OFF" and the red light-emitting diode turns "ON."

Figure 4:
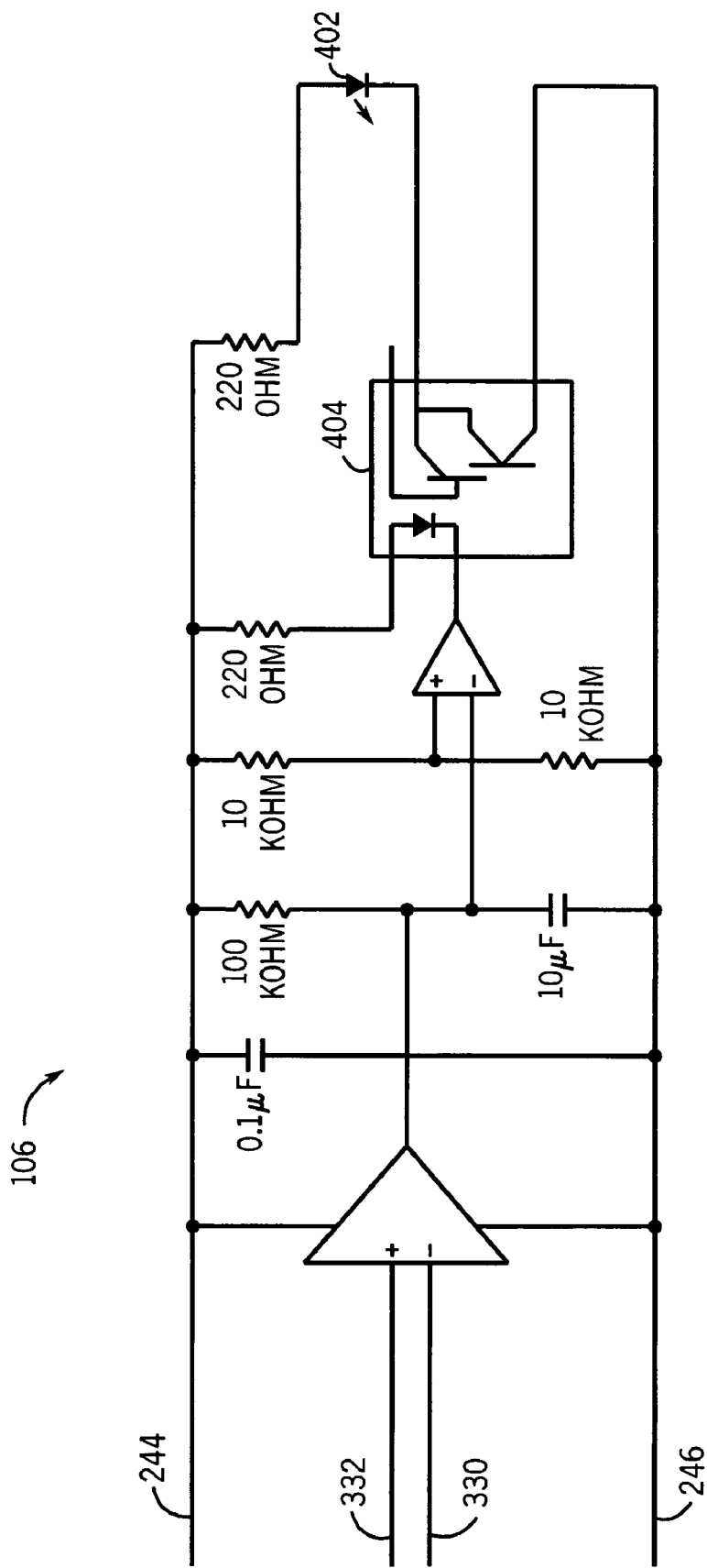
FIG. 4 is a schematic representation of an exemplary alarm component of the apparatus of FIG. 1.

Referring to FIG. 4, the alarm component 106 in one example employs an operational amplifier circuit to filter one or more transient leakage currents from the polyphase power system. Transient leakage currents may be caused when electrical equipment that uses power from the phase terminals 208, 210, and 212 starts up or shuts down, as will be appreciated by those skilled in the art. The transient leakage currents can cause momentary fluctuations between the "ON" and "OFF" positions of the light-emitting diode 328. The operational amplifier circuit of the alarm component 106 filters the transient leakage currents that are present for less than a defined time interval to promote an increase in accuracy of fault indication, as will be appreciated by those skilled in the art. For example, faults that last less than two seconds are not indicated. The alarm component 106 in one example employs an optoisolator 404 to allow driving of a remote alarm indicator, for example, a light-emitting diode 402.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, a polyphase power system with a system safety ground, wherein the polyphase power system supplies a plurality of power phases over a respective plurality of power lines to power a load, the apparatus comprising:
   a fault detection component;
   wherein the fault detection component comprises a plurality of phase fault detectors that monitor the plurality of power lines, respectively;
   wherein the plurality of phase fault detectors comprise a phase fault detector that monitors a power line of the plurality of power lines;
   wherein the phase fault detector comprises a diode, coupled with the power line, and a voltage divider, coupled with the diode, that outputs a threshold voltage, wherein the threshold voltage comprises a line-to-ground voltage relative to a localized ground;
   wherein the fault detection component comprises a first capacitor, coupled between the localized ground and the system safety ground, and a second capacitor, coupled between the diode and the localized ground in parallel with the voltage divider such that the second capacitor is charged on a positive cycle of the line-to-ground voltage wherein the first and second capacitor comprise an adjustable capacitance ratio;

wherein the first capacitor provides a direct current offset to the localized ground upon a ground fault condition;

wherein the phase fault detector compares the threshold voltage with a reference voltage to make a determination of an existence of the ground fault condition in the power line;

wherein the phase fault detector adjusts a sensitivity of the determination of the existence of the ground fault condition in the power line by changing the adjustable capacitance ratio.

2. The apparatus of claim 1, wherein the voltage divider comprises an adjustable voltage divider for adjustment of the voltage.

3. The apparatus of claim 1, wherein the plurality of phase fault detectors comprise first, second, and third phase fault detectors, wherein the plurality of power lines of the polyphase power system comprise respective first, second, and third power lines;

wherein the fault detection component employs one or more of the first, second, and third phase fault detectors to make the determination of the existence of the one or more ground fault conditions in one or more of the plurality of power lines.

4. The apparatus of claim 1, further comprising:

an alarm component that comprises an operational amplifier circuit that serves to promote an increase in an accuracy of the determination of the existence of the one or more ground fault conditions through a reduction of one or more effects of transient leakage currents in the polyphase power system.

5. The apparatus of claim 4, wherein the alarm component comprises an optoisolator that serves to drive a remote alarm indicator upon the determination of the existence of the one or more ground fault conditions in one or more of the plurality of power lines.

6. The apparatus of claim 4, wherein the operational amplifier circuit serves to filter effects of transient leakage currents from the polyphase power system.

7. The apparatus of claim 6, wherein the effects of transient leakage currents from the polyphase power system comprise effects of transient leakage currents that are present for less than a defined time interval;

wherein the operational amplifier circuit filters the effects of the transient leakage currents that are present for less than the defined time interval.

8. The apparatus of claim 7, wherein the defined time interval is approximately two seconds.

9. The apparatus of claim 1, further comprising:

a power status component that serves to indicate a current status of the plurality of power phases of the polyphase power system.

10. The apparatus of claim 1, wherein the plurality of phase fault detectors cooperate to detect unbalanced leakage currents.

11. The apparatus of claim 1, wherein the first capacitor comprises no potential difference between the localized ground and the system safety ground in a balanced load condition.

12. The apparatus of claim 1, wherein the first capacitor smoothes an alternating current through the localized ground in an unbalanced load condition to provide the direct current offset to the localized ground relative to the system safety ground.

13. An apparatus, a polyphase power system with a system safety ground, wherein the polyphase power system supplies a plurality of power phases over a respective plurality of power lines to power a load, the apparatus comprising:

a power status component that serves to indicate a current status of the plurality of power phases of the polyphase power system;

a fault detection component; and an alarm component that comprises an operational amplifier circuit that serves to promote an increase in an accuracy of the determination of the existence of the one or more ground fault conditions through a reduction of one or more effects of transient leakage currents in the polyphase power system;

wherein the fault detection component comprises a plurality of phase fault detectors that monitor the plurality of power lines, respectively;

wherein the plurality of phase fault detectors comprise a phase fault detector that monitors the plurality of power lines, respectively;

wherein the phase fault detector comprises a diode, coupled with the power line, and a voltage divider, coupled with the diode, that outputs a threshold voltage, wherein the threshold voltage comprises a line-to-ground voltage relative to a localized ground;

wherein the fault detection component comprises a first capacitor, between the localized ground and the system safety ground, and a second capacitor, coupled between the diode and the localized around in parallel with the voltage divider, wherein the first and second capacitor comprise an adjustable capacitance ratio;

wherein the first capacitor provides a direct current offset to the localized ground upon a ground fault condition;

wherein the phase fault detector compares the threshold voltage with a reference voltage to make a determination of an existence of the ground fault in the power line;

wherein the phase fault detector adjusts a sensitivity of the determination of the existence of the ground fault condition in the power line by changing the adjustable capacitance ratio.

14. The apparatus of claim 13, wherein the operational amplifier circuit serves to filter effects of transient leakage currents from the polyphase power system.

15. The apparatus of claim 13, wherein the voltage divider comprises an adjustable voltage divider for adjustment of the threshold voltage.

16. A method for making a determination of an existence of a ground fault condition in, a polyphase power system with a system safety ground, wherein the polyphase power system supplies a plurality of power phases over a respective plurality of power lines to power a load, the method comprising the steps of:

adjusting a voltage divider of a fault detection component to promote an accuracy for adjustment of a threshold for a determination of an existence of one or more ground fault conditions in one or more of the plurality of power lines;

making a comparison of a divided voltage from the voltage divider and a reference voltage;

adjusting a capacitance ratio between a first capacitor, between a localized ground and the system safety ground, and a second capacitor, between one power line and the localized ground, to adjust a sensitivity of the determination of the existence of the one or more ground fault conditions in the one or more of the plurality of power lines; and making the determination of the existence of the one or more ground fault conditions in the one or more of the plurality of power lines based on the comparison of the divided voltage from the voltage divider and the reference voltage.

17. The method of claim 16, further comprising the step of:

smoothing an alternating current through the localized ground in an unbalanced load condition through employment of the first capacitor to provide a direct current offset to the localized ground relative to the system safety ground.

* * * * *